(12) United States Patent
Cheng et al.

(10) Patent No.: US 9,093,326 B2
(45) Date of Patent: Jul. 28, 2015

(54) ELECTRICALLY ISOLATED SIGE FIN FORMATION BY LOCAL OXIDATION

(71) Applicant: International Business Machines Corporation, Armonk, NY (US)

(72) Inventors: Kangguo Cheng, Schenectady, NY (US); Hong He, Schenectady, NY (US); Chiahsun Tseng, Wynantskill, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/058,341

(22) Filed: Oct. 21, 2013

(65) Prior Publication Data

US 2015/0108572 A1    Apr. 23, 2015

(51) Int. Cl.
| | |
|---|---|
| *H01L 29/66* | (2006.01) |
| *H01L 27/12* | (2006.01) |
| *H01L 21/8234* | (2006.01) |
| *H01L 21/84* | (2006.01) |
| *H01L 29/78* | (2006.01) |

(52) U.S. Cl.
CPC .... *H01L 27/1211* (2013.01); *H01L 21/823431* (2013.01); *H01L 21/823481* (2013.01); *H01L 21/845* (2013.01); *H01L 29/7831* (2013.01)

(58) Field of Classification Search
CPC .................. H01L 27/1211; H01L 21/823431; H01L 21/854; H01L 27/0886; H01L 29/7831
USPC ............ 257/E29.264, E29.275, 331; 438/283
See application file for complete search history.

(56) References Cited

U.S. PATENT DOCUMENTS

| | | | | |
|---|---|---|---|---|
| 8,466,028 | B2 * | 6/2013 | Yin et al. ........................ | 438/283 |
| 2013/0161756 | A1 * | 6/2013 | Glass et al. ................... | 257/369 |
| 2014/0015056 | A1 * | 1/2014 | Fu et al. ........................ | 257/368 |
| 2014/0061862 | A1 * | 3/2014 | Vega et al. .................... | 257/616 |

OTHER PUBLICATIONS

Balakumar, S. et al., "Germanium-Rich SiGe Nanowires Formed Through Oxidation of Patterned SiGe FINs on Insulator" Journal of Electronic Materials (Mar. 2009) pp. 443-448, vol. 38, issue 3.

(Continued)

*Primary Examiner* — Kimberly Rizkallah
*Assistant Examiner* — Maria Ligai
(74) *Attorney, Agent, or Firm* — Scully, Scott, Murphy & Presser, P.C.; H. Daniel Schnumann (57) ABSTRACT

A silicon germanium alloy layer is formed on a semiconductor material layer by epitaxy. An oxygen impermeable layer is formed on the silicon germanium alloy layer. The oxygen impermeable layer and the silicon germanium alloy layer are patterned to form stacks of a silicon germanium alloy fin and an oxygen impermeable cap. A shallow trench isolation structure is formed by deposition, planarization, and recessing or an oxygen permeable dielectric material. An oxygen impermeable spacer is formed around each stack of a silicon germanium alloy fin and an oxygen impermeable cap. A thermal oxidation process is performed to convert a lower portion of each silicon germanium alloy fin into a silicon germanium oxide. During the thermal oxidation process, germanium atoms diffuse into unoxidized portions of the silicon germanium alloy fins to increase the germanium concentration therein.

18 Claims, 12 Drawing Sheets

(56) References Cited

OTHER PUBLICATIONS

Liow, T.Y. et al., "Investigation of Silicon-Germanium Fins Fabricated Using Germanium Condensation on Vertical Compliant Structures" Applied Physics Letters (Dec. 19, 2005) pp. 262104-1-262104-3, vol. 87, issue 26.

* cited by examiner

ELECTRICALLY ISOLATED SIGE FIN FORMATION BY LOCAL OXIDATION

BACKGROUND

The present disclosure relates to a semiconductor structure, and particularly to a semiconductor structure including electrically isolated SiGe fins, and a method for manufacturing the same.

A finFET is field effect transistor including a channel located in a semiconductor fin having a height that is greater than a width. FinFETs employ vertical surfaces of semiconductor fins to effectively increase a device area without increasing the physical layout area of the device. Fin based devices are compatible with fully depleted mode operation if the lateral width of the fin is thin enough. For these reasons, fin based devices can be employed in advanced semiconductor chips to provide high performance devices.

Formation of a silicon germanium alloy fin including a high concentration of germanium on a silicon substrate is difficult because of large lattice mismatch between silicon and germanium. As the atomic germanium concentration increases in a silicon germanium alloy that is epitaxially formed on a silicon layer, defect density within the silicon germanium alloy also increases. Silicon germanium alloy fins patterned from the silicon germanium alloy also include high density of defects, which degrade performance of semiconductor devices formed on the silicon germanium alloy fins.

SUMMARY

A silicon germanium alloy layer is formed on a semiconductor material layer by epitaxy. An oxygen impermeable layer is formed on the silicon germanium alloy layer. The oxygen impermeable layer and the silicon germanium alloy layer are patterned to form stacks of a silicon germanium alloy fin and an oxygen impermeable cap. A shallow trench isolation structure is formed by deposition, planarization, and recessing or an oxygen permeable dielectric material. An oxygen impermeable spacer is formed around each stack of a silicon germanium alloy fin and an oxygen impermeable cap above the shallow trench isolation structure. After deposition of a disposable oxygen permeable material between silicon germanium alloy fins, a thermal oxidation process is performed to convert a lower portion of each silicon germanium alloy fin into a silicon germanium oxide. During the thermal oxidation process, germanium atoms diffuse into unoxidized portions of the silicon germanium alloy fins to increase the germanium concentration therein, thereby providing silicon germanium alloy fins with a higher germanium concentration than the silicon germanium alloy layer as formed on the semiconductor material layer. Further, the thermal oxidation process electrically isolates each remaining portion of the silicon germanium alloy fins.

According to an aspect of the present disclosure, a semiconductor structure is provided. The semiconductor structure includes a semiconductor oxide material portion that contains a semiconductor oxide layer located on a semiconductor material layer and further contains a plurality of semiconductor oxide pedestals that protrudes above the semiconductor oxide layer. A plurality of silicon germanium alloy fins is located on the plurality of semiconductor oxide pedestals. Each of the plurality of silicon germanium alloy fins is located directly on, and above, one of the plurality of semiconductor oxide pedestals. A shallow trench isolation structure contacts a top surface of the semiconductor oxide layer and sidewalls of the plurality of semiconductor oxide pedestals. Bottommost portions of the plurality of silicon germanium alloy fins are more distal from the semiconductor oxide layer than a planar top surface of the shallow trench isolation structure is from the semiconductor oxide layer.

According to another aspect of the present disclosure, a method of forming a semiconductor structure is provided. A plurality of vertical stacks is formed on a semiconductor material layer. Each of the plurality of vertical stacks includes a silicon germanium alloy fin and an oxygen impermeable cap. A shallow trench isolation structure laterally surrounding lower portions of the plurality of vertical stacks is formed directly on a top surface of the semiconductor material layer. The shallow trench isolation structure includes an oxygen permeable material. An oxygen impermeable spacer is formed directly on sidewalls of upper portions of the plurality of vertical stacks. An upper portion of the semiconductor material layer and lower portions of each of the plurality of silicon germanium alloy fins are oxidized employing an oxidation process. Sidewall surfaces of remaining portions of the plurality of silicon germanium alloy fins are physically exposed by removing the plurality of oxygen impermeable spacers and the plurality of oxygen impermeable caps.

DETAILED DESCRIPTION

As stated above, the present disclosure relates to a semiconductor structure including electrically isolated SiGe fins, and a method for manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

Figure 1:
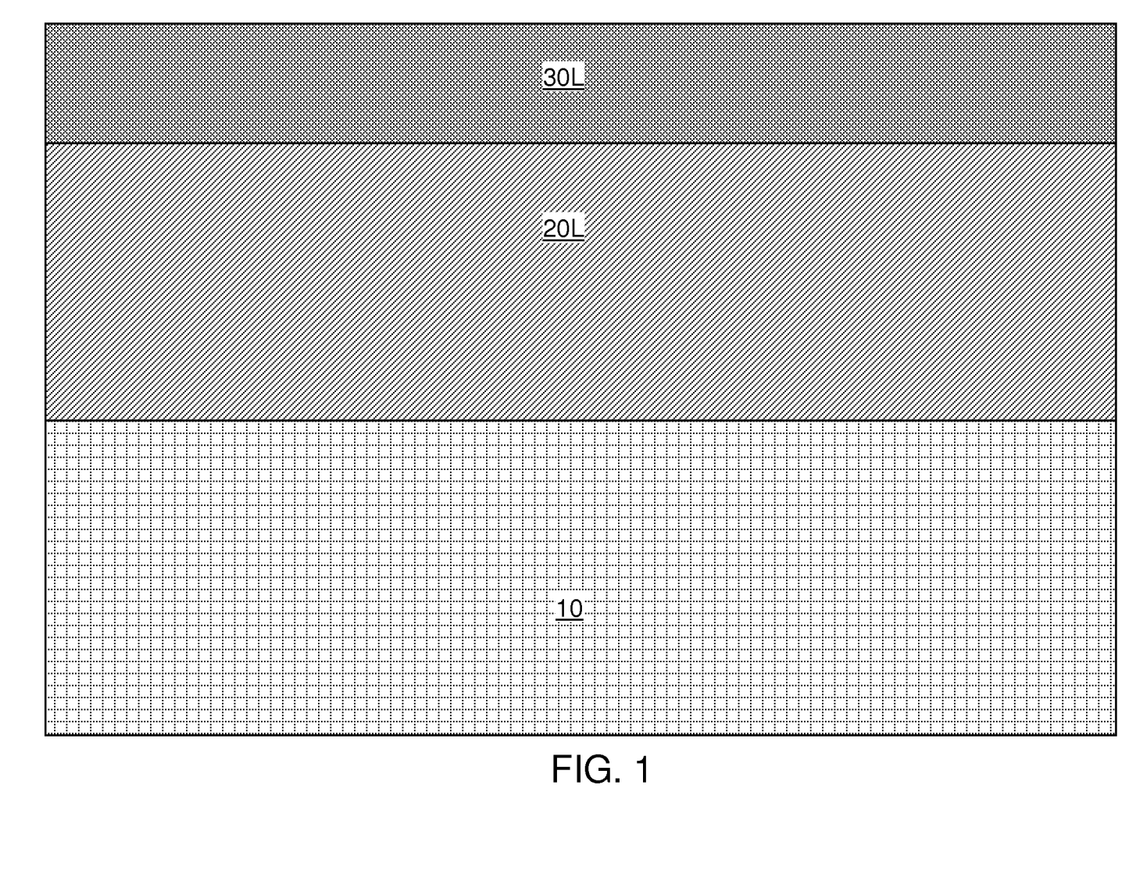
FIG. 1 is a vertical cross sectional view of an exemplary semiconductor structure after formation of a silicon germanium alloy layer and an oxygen impermeable layer on a semiconductor material layer according to an embodiment of the present disclosure.

Referring to FIG. 1, an exemplary semiconductor structure according to an embodiment of the present disclosure includes a semiconductor material layer 10. The semiconductor material layer 10 includes a semiconductor material, which can be an elemental semiconductor material, a compound semiconductor material, or an organic semiconductor material. In one embodiment, the semiconductor material layer 10 includes a silicon-containing semiconductor material. The silicon-containing semiconductor material may be silicon, a silicon germanium alloy, a silicon carbon alloy, a silicon germanium carbon alloy, or a stack thereof. In one embodiment, the silicon-containing semiconductor material can be single crystalline. In one embodiment, the entirety of the semiconductor material layer 10 can be single crystalline. The semiconductor material of the semiconductor material layer 10 may be intrinsic, p-doped, n-doped, or may be a combination of differently doped regions. In one embodiment, the entirety of the semiconductor material layer 10 can be a single crystalline silicon layer.

A silicon germanium alloy layer 20L is formed on the top surface of the semiconductor material layer 20L. The silicon germanium alloy layer 20L can be formed, for example, by epitaxy of a silicon germanium alloy material on the semiconductor material layer 10 employing an epitaxial deposition process known in the art. Alternately, the silicon germanium alloy layer 20L may be formed by implantation of germanium into a silicon-containing material within the semiconductor material layer 20L. In this case, the silicon-containing material within the semiconductor material layer 10 may be silicon or a silicon-germanium alloy. Optionally, a thermal anneal may be performed to heal crystalline defects within the implanted region. The implanted region becomes the silicon germanium alloy layer 20L.

The silicon germanium alloy layer 20L includes a greater atomic concentration of germanium than the semiconductor material layer 20L. In one embodiment, the atomic concentration of germanium within the silicon germanium alloy layer 20L can be in a range from 5% to 25%. In one embodiment, the atomic concentration of germanium within the silicon germanium alloy layer 20L can be set at a highest level that does not introduce crystalline defects within the silicon germanium alloy layer 20L. Thus, the semiconductor material layer 10 does not include germanium, or includes less germanium than the silicon germanium alloy layer 20L. The thickness of the silicon germanium alloy layer 20L can be in a range from 20 nm to 400 nm.

The silicon germanium alloy layer 20L can be single crystalline, and can be epitaxially aligned to a single crystalline semiconductor material within the semiconductor material layer 10. In one embodiment, the thickness of the silicon germanium alloy layer 20L can be less than the critical thickness of the silicon germanium alloy material above which the silicon germanium alloy material would develop dislocations and other crystalline defects. In this case, the entirety of the silicon germanium alloy material within the silicon germanium alloy layer 20L can be pseudomorphic to the single crystalline structure of the semiconductor material layer 10 without strain relaxation by dislocations, and the lattice parameters of the silicon germanium alloy material along the horizontal directions match the corresponding lattice parameters of the single crystalline material in the semiconductor material layer 10 along the horizontal directions.

Optionally, after forming the silicon germanium alloy layer 20L, a silicon cap (not shown) can be grown on top of the silicon germanium alloy layer 20L. The optional silicon cap can help protecting the silicon germanium alloy layer 20L during subsequent processing steps. For example, an oxygen impermeable material layer 30L can be formed directly on the silicon cap instead of the silicon germanium alloy layer 20L. If formed, the silicon cap is subsequently incorporated into the silicon germanium alloy layer 20L because Ge in the underlying silicon germanium alloy layer 20L will diffuse upwards into the silicon cap.

An oxygen impermeable material layer 30L is formed over the stack of the semiconductor material layer 10 and the silicon germanium alloy layer 20L. As used herein, an "oxygen impermeable" element refers to an element composed of a material having an oxygen diffusion rate that does not exceed 1/10 of the oxygen diffusion rate of a silicon nitride material formed by low pressure chemical vapor deposition (LPCVD) within a temperature range between 600 degrees Celsius and 1,000 degrees Celsius. The oxygen impermeable material layer 30L can include a nitride of a semiconductor material or a nitride of a metallic material. For example, the oxygen impermeable material layer 30L can include silicon nitride or tantalum nitride. The oxygen impermeable material layer 30L can be deposited, for example, by chemical vapor deposition (CVD), physical vapor deposition (PVD), or atomic layer deposition (ALD). The thickness of the oxygen impermeable material layer 30L can be in a range from 3 nm to 60 nm, although lesser and greater thicknesses can also be employed.

Figure 2:
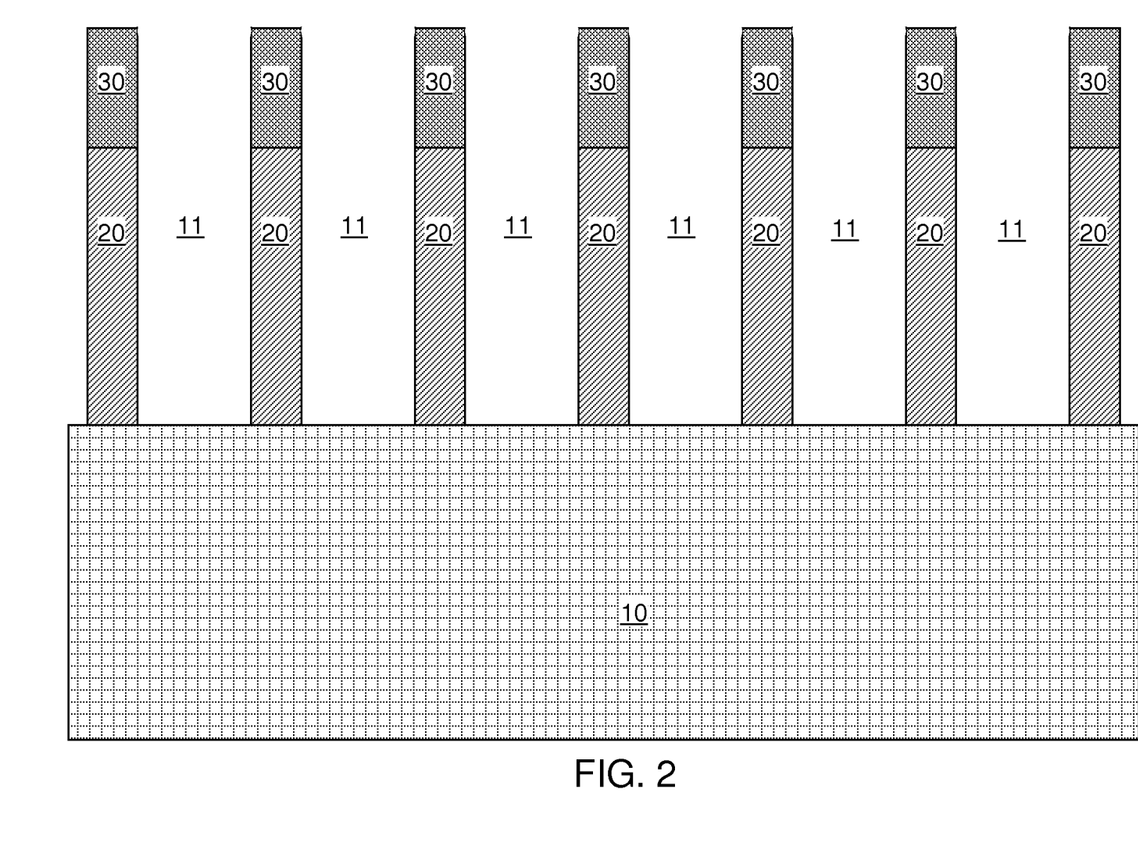
FIG. 2 is a vertical cross sectional view of the exemplary semiconductor structure after formation of silicon germanium alloy fins and oxygen impermeable caps according to an embodiment of the present disclosure.
Figure 2A:
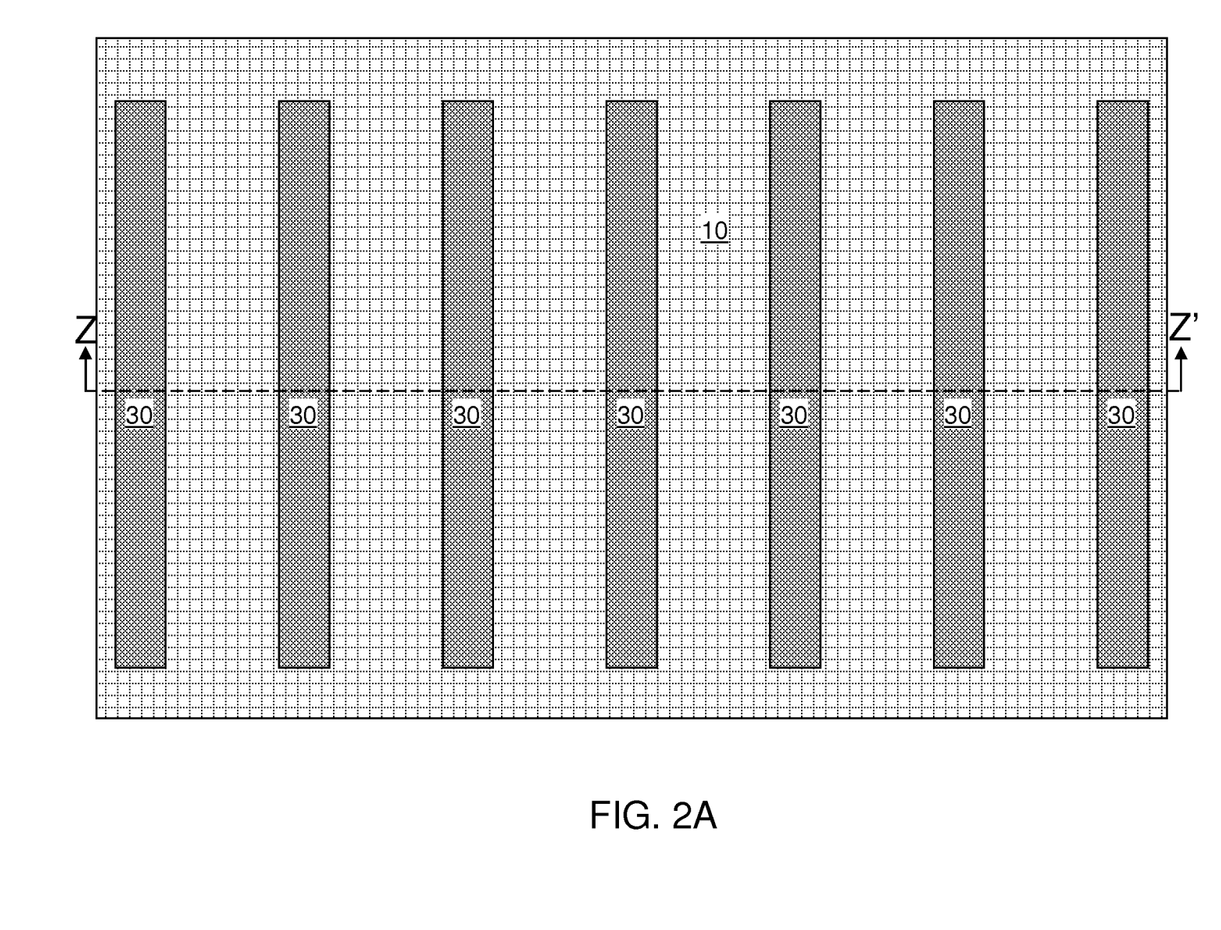
FIG. 2A is a top down view of the exemplary semiconductor structure of FIG. 2. The vertical plane Z-Z' represents the plane of the vertical cross sectional view of FIG. 2.

Referring to FIGS. 2 and 2A, the oxygen impermeable material layer 30L and the silicon germanium alloy layer 20L can be patterned into a plurality of vertical stacks, each including a silicon germanium alloy fin 20 and an oxygen impermeable cap 30 and the optional silicon cap. The patterning of the oxygen impermeable material layer 30L and the silicon germanium alloy layer 20L can be performed, for example, by applying and lithographically patterning a photoresist layer (not shown) over the top surface of the oxygen impermeable material layer 30L, and transferring the pattern in the photoresist layer through the oxygen impermeable material layer 30L and the silicon germanium alloy layer 20L by an anisotropic etch that employs the patterned photoresist layer as an etch mask.

The anisotropic etch may, or may not, be selective to the semiconductor material of the semiconductor material layer 10. In one embodiment, the anisotropic etch can be selective to the semiconductor material of the semiconductor material layer 10. In another embodiment, top surfaces of the semiconductor material layer 10 may be vertically recessed between each adjacent pair of vertical stacks (20, 30) of the silicon germanium alloy fins 20 and oxygen impermeable caps 30. In yet another embodiment, a horizontal bottom portion of the silicon germanium alloy layer 20L may remain between each adjacent pair of vertical stacks (20, 30) of the silicon germanium alloy fins 20 and oxygen impermeable caps 30. A contiguous trench 11 laterally surrounds the plurality of vertical stacks (20, 30) of a silicon germanium alloy fin 20 and an oxygen impermeable cap 30. The photoresist layer is subsequently removed, for example, by ashing. Alternatively, sidewall imaging transfer technique can be used for forming the silicon germanium alloy fins 20.

As used herein, a "semiconductor fin" refers to a contiguous structure including a semiconductor material and including at least one pair of substantially vertical sidewalls that are parallel to each other. As used herein, a surface is "substantially vertical" if there exists a vertical plane from which the surface does not deviate by more than three times the root mean square roughness of the surface. As used herein, a "silicon germanium alloy fin" refers to a semiconductor fin composed of a silicon germanium alloy material.

In one embodiment, within each vertical stack of a silicon germanium alloy fin 20 and an oxygen impermeable cap 30, sidewalls of the silicon germanium alloy fin 20 can be vertically coincident with sidewalls of the oxygen impermeable cap 30. As used herein, two surfaces are "vertically coincident" if there exists a vertical plane including the two surfaces.

In one embodiment, the oxygen impermeable caps 30 can have rectangular horizontal cross sectional areas. The horizontal direction along which longer sides of each rectangle extend is herein referred to as a lengthwise direction of the corresponding oxygen impermeable cap 30. The horizontal direction that is perpendicular to the lengthwise direction of an oxygen impermeable cap 30 is herein referred to as a widthwise direction of the corresponding oxygen impermeable cap 30. In one embodiment, the oxygen impermeable caps 30 can be arranged as a linear array in which oxygen impermeable caps 30 having a same rectangular cross sectional area are periodically placed along a common widthwise direction of the oxygen impermeable caps 30. In one embodiment, the shapes of each overlying oxygen impermeable cap 30 can be replicated in an underlying silicon germanium alloy fin 20.

Figure 3:
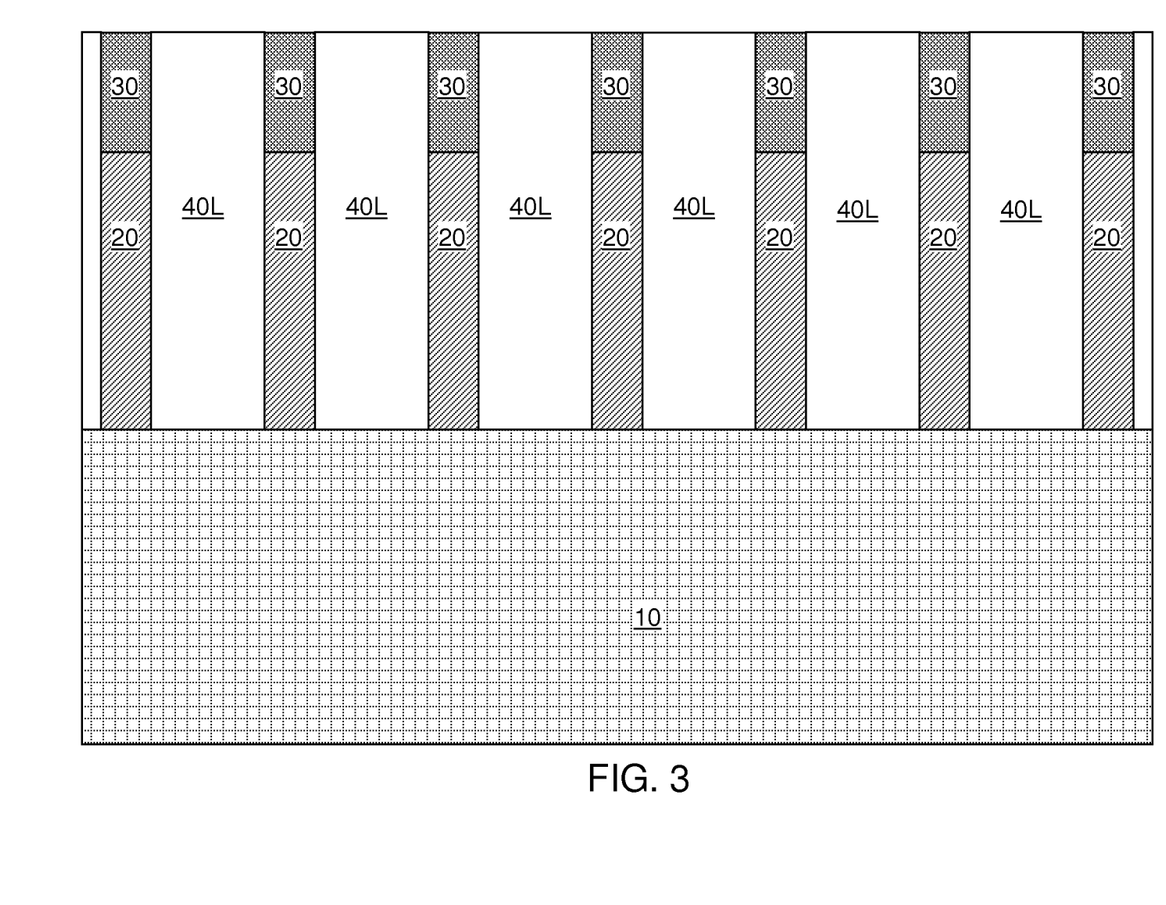
FIG. 3 is a vertical cross sectional view of the exemplary semiconductor structure after an oxygen permeable dielectric material layer according to an embodiment of the present disclosure.

Referring to FIG. 3, an oxygen permeable dielectric material is deposited in the contiguous trench 11 to fill the contiguous trench 11. As used herein, an "oxygen permeable dielectric material" refers to a dielectric material composed of a dielectric material having an oxygen diffusion rate greater than 0.8 times the oxygen diffusion rate of thermal silicon oxide within a temperature range between 600 degrees Celsius and 1,000 degrees Celsius. The oxygen permeable dielectric material can be, for example, undoped silicate glass, fluorosilicate glass, phosphosilicate glass, or a spin-on glass (SOG) material. The oxygen permeable dielectric material can be deposited by chemical vapor deposition, atomic layer deposition, or spin coating. The oxygen permeable dielectric material can be deposited to fill the entirety of the contiguous trench 11, and any portion of the oxygen permeable dielectric material above a horizontal plane including the top surfaces of the oxygen permeable caps 30 can be removed by planarization. For example, chemical mechanical planarization (CMP) can be employed to remove excess portions of the deposited oxygen permeable dielectric material from above the horizontal plane including the top surfaces of the oxygen permeable caps 30 can be removed by planarization. Remaining portions of the oxygen permeable dielectric material constitutes a shallow trench isolation (STI) dielectric material layer 40L.

Figure 4:
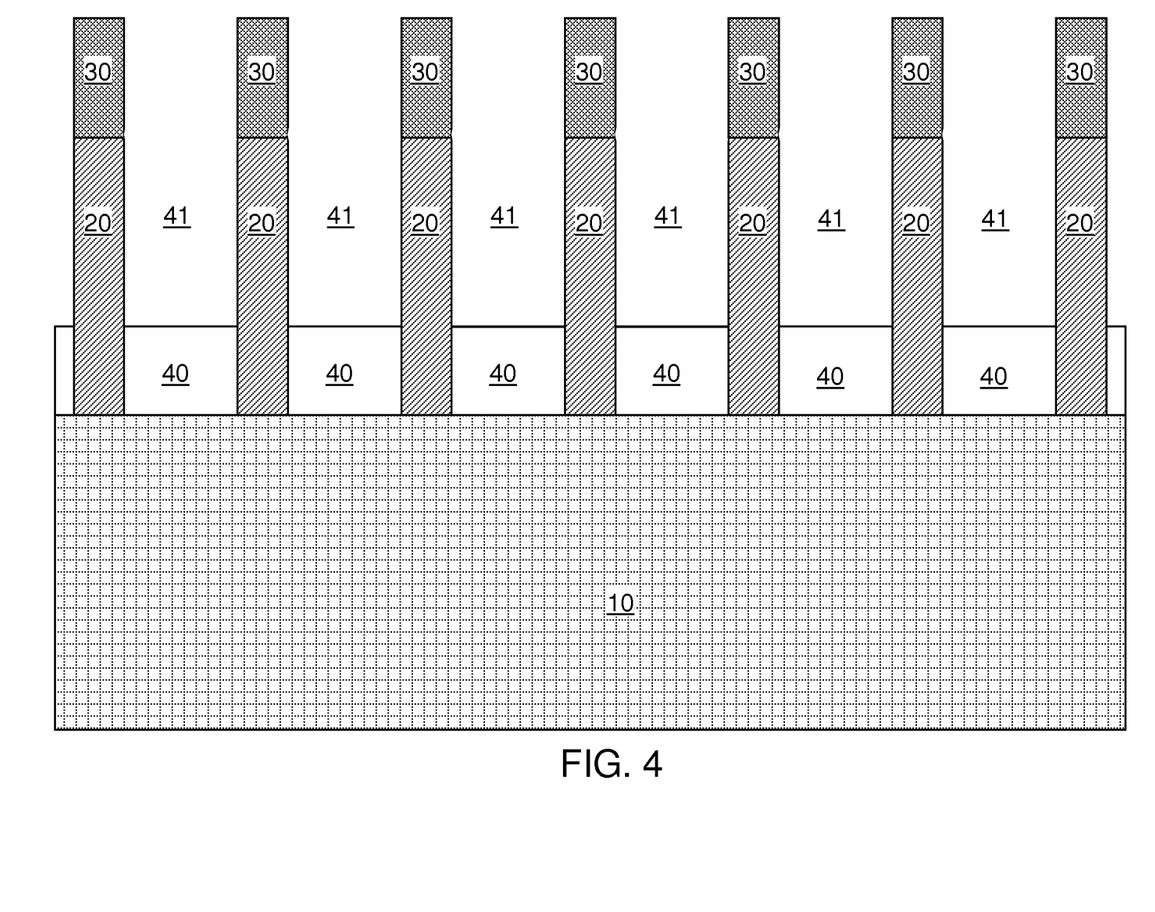
FIG. 4 is a vertical cross sectional view of the exemplary semiconductor structure after recessing the oxygen permeable dielectric material layer to form a shallow trench isolation structure according to an embodiment of the present disclosure.

Referring to FIG. 4, the oxygen permeable dielectric material of the STI dielectric material layer 40L is vertically recessed by an etch that is selective to the material of the oxygen impermeable caps 30. In one embodiment, the etch can be an isotropic etch that is selective to the material of the oxygen impermeable caps 30 and the material of the silicon germanium alloy fins 20. For example, the etch can be a wet etch employing hydrofluoric acid. In another embodiment, the etch can be an anisotropic etch such as a reactive ion etch.

Remaining portions of the STI dielectric material layer 40L after the etch constitutes an STI structure 40, which is a contiguous structure including the oxygen permeable dielectric material and laterally surround lower portions of each silicon germanium alloy fin 20. The thickness of the STI structure 40 can be in a range from 5% of the height of the silicon germanium alloy fins to 60% of the height of the silicon germanium alloy fins. Further, the thickness of the STI structure 40 can be in a range from 4 nm to 100 nm, although lesser and greater thicknesses can also be employed. A contiguous trench 41 overlying the STI structure 40 laterally surrounds upper portions of the silicon germanium alloy fins 20 and all of the oxygen impermeable caps 30. In one embodiment, the STI structure 40 can laterally surround lower portions of the plurality of vertical stacks (20, 30) located directly on the top surface of the semiconductor material layer 10.

Figure 5:
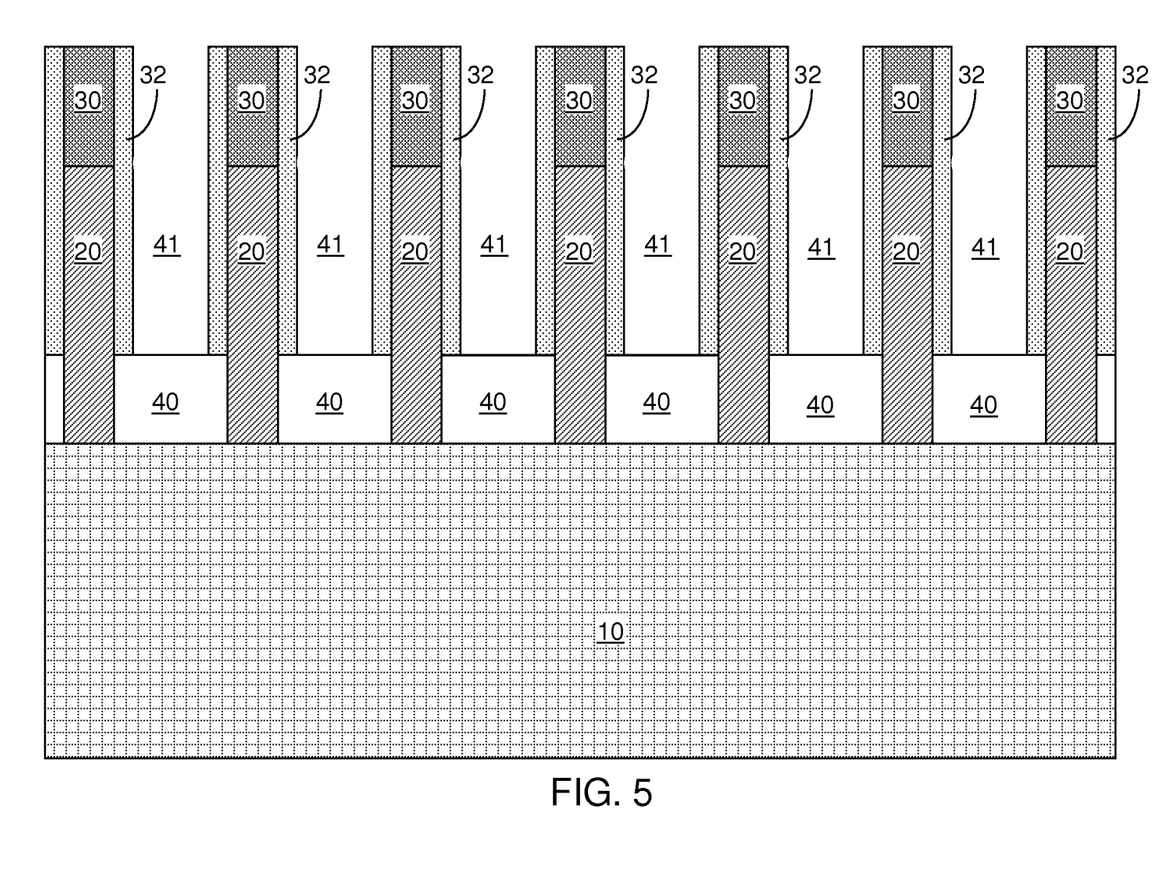
FIG. 5 is a vertical cross sectional view of the exemplary semiconductor structure after formation of oxygen impermeable spacers according to an embodiment of the present disclosure.

Referring to FIG. 5, oxygen impermeable spacers 32 are formed directly on sidewalls of upper portions of the plurality of vertical stacks (20, 30) of a silicon germanium alloy fin 20 and an oxygen impermeable cap 30. The oxygen impermeable spacers 32 can be formed, for example, by depositing a conformal oxygen impermeable material layer employing chemical vapor deposition (CVD) or atomic layer deposition (ALD), and by anisotropically etching horizontal portions of the conformal oxygen impermeable material layer by an anisotropic etch. Horizontal portions of the conformal oxygen impermeable material layer are removed by the anisotropic etch, and remaining vertical portions of the conformal oxygen impermeable material layer constitute the oxygen impermeable spacers 32. The anisotropic etch may be selective, or non-selective to the oxygen permeable dielectric material of the STI structure 40. The selectivity of the anisotropic etch is selected such that the ST structure 40 is not punched through during the anisotropic etch. In one embodiment, the anisotropic etch may be selective to the oxygen permeable material of the STI structure 40.

In one embodiment, the oxygen impermeable spacer 32 includes a dielectric nitride of a semiconductor material such as silicon nitride or a metallic nitride such as titanium nitride. The thickness of the oxygen impermeable spacers 32 is less than one half of the minimum spacing between a neighboring pair of the plurality of vertical stacks (20, 30) of a silicon germanium alloy fin 20 and an oxygen impermeable cap 30.

Figure 6:
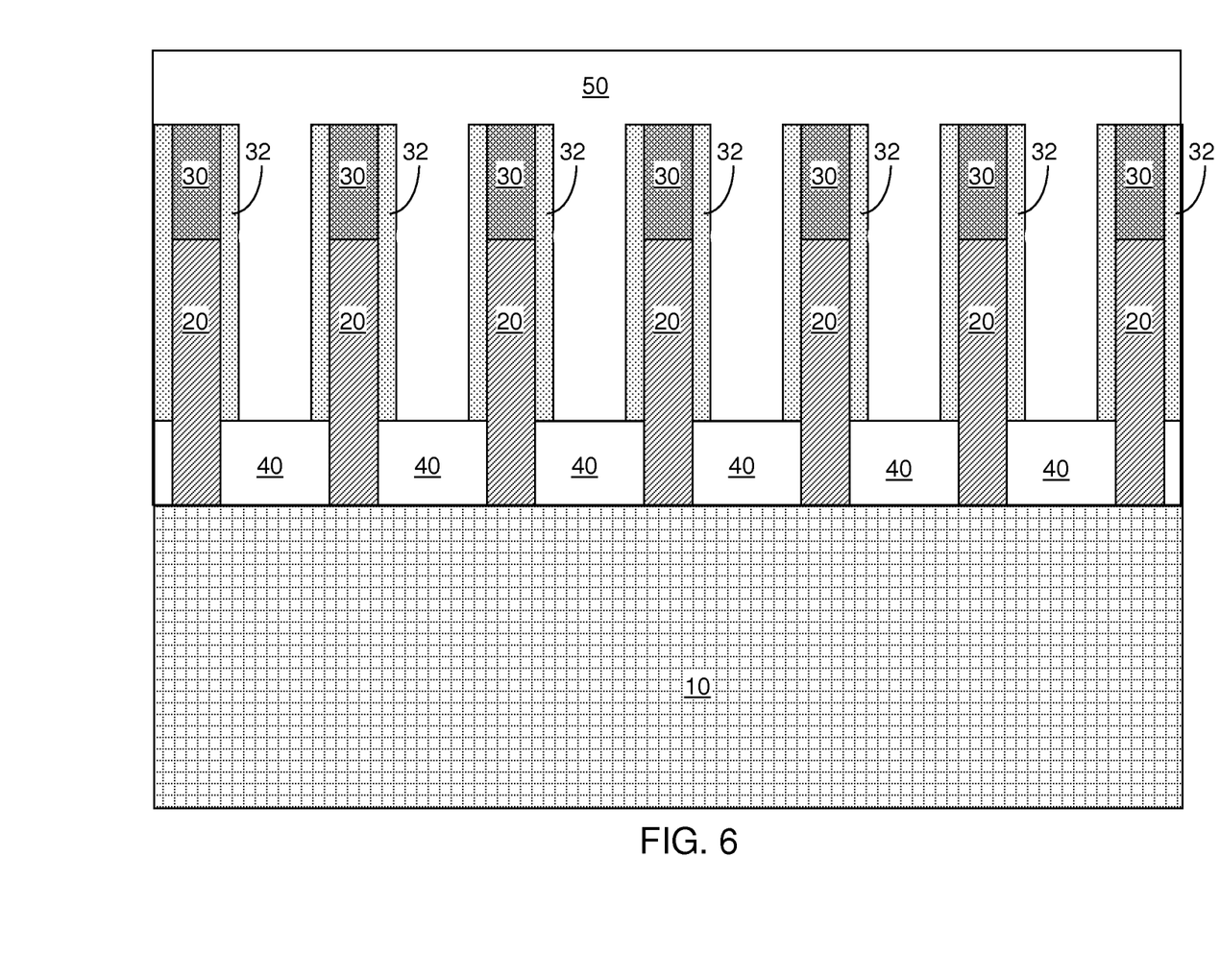
FIG. 6 is a vertical cross sectional view of the exemplary semiconductor structure after optional formation of a disposable oxygen permeable material layer according to an embodiment of the present disclosure.

Referring to FIG. 6, a disposable oxygen permeable material layer 50 may optionally be formed within the contiguous trench 41 by depositing an oxygen permeable material therein. The disposable oxygen permeable material layer 50 is an oxygen permeable material layer that is removed in a subsequent processing step. The oxygen permeable material layer 50 is formed above the shallow trench isolation structure 40 and between the plurality of vertical stacks (20, 30). The oxygen permeable dielectric material is deposited to a height above topmost surfaces of the plurality of vertical stacks (20, 30).

The disposable oxygen permeable material layer 50 includes an oxygen permeable dielectric material such as undoped silicon oxide, borosilicate glass (BSG), fluorosilicate glass (FSG), borophosphosilicate glass (BPSG), or a spin-on glass material. The disposable oxygen permeable material layer 50 can be formed by chemical vapor deposition (CVD) or spin coating.

In one embodiment, an entirety of the top surface of the disposable oxygen permeable material layer 50 can be located above the horizontal plane including the top surfaces of the oxygen impermeable caps 30. In another embodiment, portions of the disposable oxygen permeable material layer 50 above the horizontal plane including the top surfaces of the oxygen impermeable caps 30 can be removed by planarization, for example, by chemical mechanical planarization or a recess etch. In this case, the top surface of the disposable oxygen permeable material layer 50 may be coplanar with the top surfaces of the oxygen impermeable caps 30.

In one embodiment, the oxygen permeable material within the disposable oxygen permeable material layer 50 can be different from the oxygen permeable material within the STI structure 40. In one embodiment, the oxygen permeable material within the disposable oxygen permeable material layer 50 can have a greater etch rate than the oxygen permeable material within the STI structure 40 in an etch chemistry such as a wet etch chemistry employing hydrofluoric acid. In one embodiment, the STI structure 40 can include undoped silicate glass, and the disposable oxygen permeable material layer 50 can include borosilicate glass.

Figure 7:
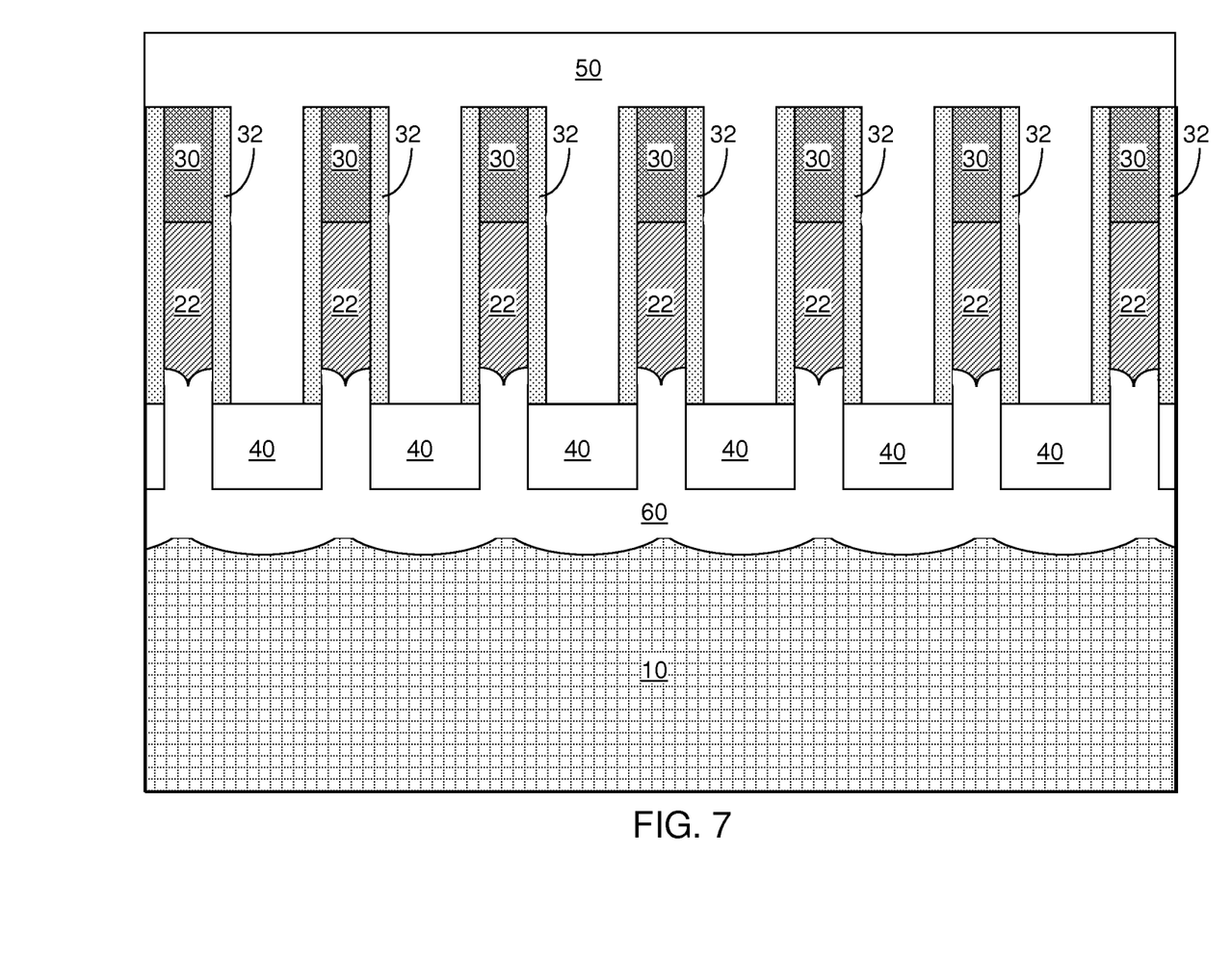
FIG. 7 is a vertical cross sectional view of the exemplary semiconductor structure after a thermal oxidation step that converts an upper portion of the semiconductor material layer and each bottom portion of the silicon germanium alloy fins into a contiguous semiconductor oxide portion according to an embodiment of the present disclosure.

Referring to FIG. 7, a thermal oxidation process is performed to oxidize upper portion of the semiconductor material layer 10 and bottom portions of each silicon germanium alloy fin 20 that are proximal to the shallow trench isolation structure 40. During the thermal oxidation process, oxidizing species diffuse through the disposable oxygen permeable material layer 50 and through the shallow trench isolation structure 40, and enter the upper portion of the semiconductor material layer 10 and bottom portions of each silicon germanium alloy fin 20 (See FIG. 6). The oxidizing species may be oxygen molecules, water molecules, oxygen plasma, oxygen ions, or any other species that can form a semiconductor oxide upon reaction with a semiconductor material. The oxidizing species react with the semiconductor material within the upper portion of the semiconductor material layer 10 and the bottom portions of the silicon germanium alloy fins 20 to form a contiguous semiconductor oxide portion 60. The oxygen impermeable caps 30 and the oxygen impermeable spacers 32 prevent diffusion of oxidizing species into the sidewalls or the top surfaces of the silicon germanium alloy fins 20.

The processing conditions and the duration of the thermal oxidation process can be selected such that entirety of the contiguous semiconductor oxide portion 60 is formed as a single contiguous structure, and an upper portion of each silicon germanium alloy fin 20 is not converted into a semiconductor oxide material. During thermal oxidation, germanium atoms are pushed into a remaining unoxidized silicon germanium alloy material portion from an interface between the unoxidized silicon germanium alloy material portion and an oxidized silicon germanium oxide material portion. In other words, the oxidation process drives germanium atoms from oxidized portions of the plurality of silicon germanium alloy fins 22 into unoxidized remaining portions of the plurality of silicon germanium alloy fins 22. Thus, each remaining upper portion of the silicon germanium alloy fins 20 includes a greater atomic concentration after the thermal oxidation process than prior to the thermal oxidation process, and is herein referred to as a germanium enriched silicon germanium alloy fin 22, i.e., a silicon germanium alloy fin having a greater atomic concentration of germanium compared to the silicon germanium alloy fins 20 prior to the thermal oxidation process.

During the thermal oxidation process, the presence of the disposable oxygen permeable material layer 50 provides mechanical support to each vertical stack (20, 30) of a silicon germanium alloy fin 20 and an oxygen impermeable cap 30 or to each vertical stack (22, 30) of a germanium-enriched silicon germanium alloy fin 22 and an oxygen impermeable cap 30. Thus, presence of the disposable oxygen permeable material layer 50 during the thermal oxidation process prevents lateral shifting or tilting of the vertical stack (22, 30) of a germanium-enriched silicon germanium alloy fin 22 and an oxygen impermeable cap 30. In an embodiment in which a disposable oxygen permeable material layer 50 is not present, the thermal oxidation process may proceed by diffusing oxidizing species through the shallow trench isolation structure 40.

Figure 8:
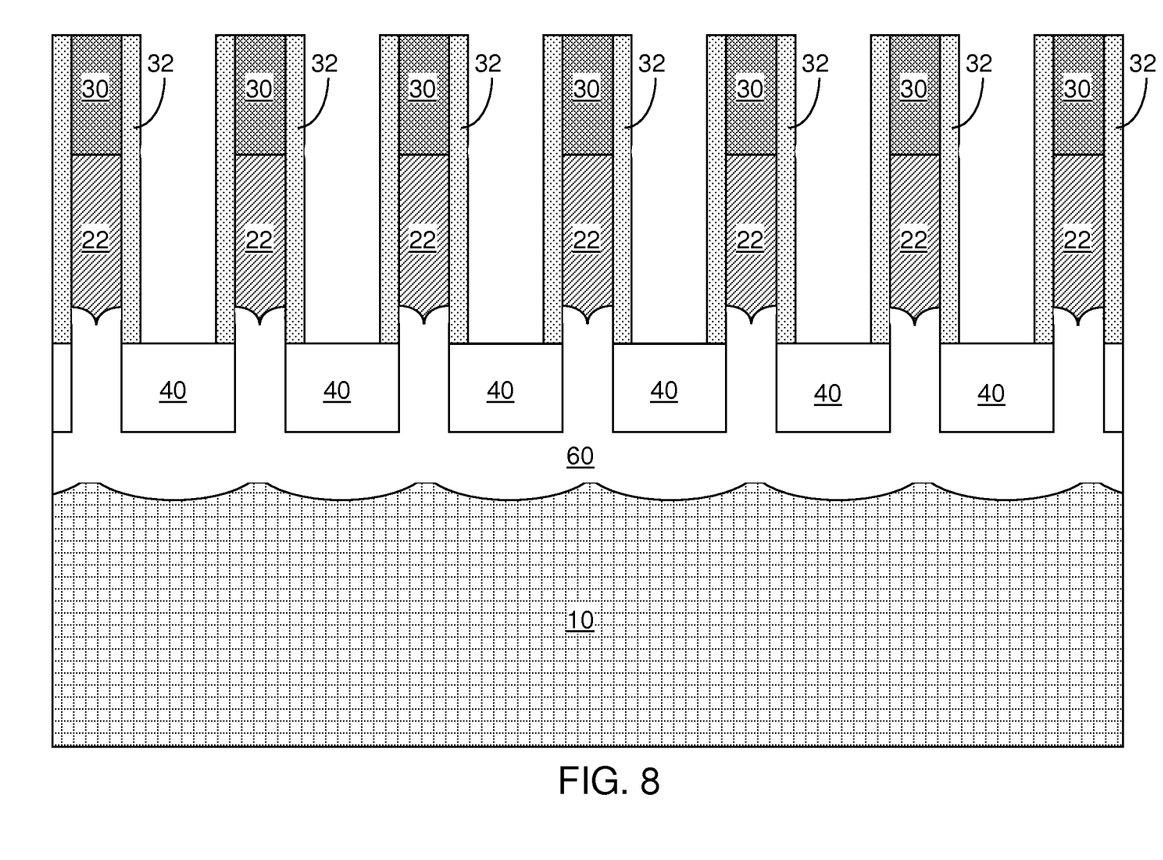
FIG. 8 is a vertical cross sectional view of the exemplary semiconductor structure after removal of the optional disposable oxygen permeable material layer according to an embodiment of the present disclosure.

Referring to FIG. 8, the optional disposable oxygen permeable material layer 50 is removed, for example, by an isotropic etch, an anisotropic etch or combination of both. In one embodiment, a wet etch employing hydrofluoric acid can be employed to remove the disposable oxygen permeable dielectric layer 50. The removal of the disposable oxygen permeable dielectric layer 50 may be selective, non-selective, or partly selective to the dielectric material of the shallow trench isolation structure 40. While the present disclosure is described employing an embodiment in which removal of the disposable oxygen permeable dielectric layer 50 is selective to the dielectric material of the shallow trench isolation structure 40, embodiments in which removal of the disposable oxygen permeable dielectric layer 50 is non-selective, or partly selective, to the dielectric material of the shallow trench isolation structure 40 can also be employed. In this case, a remaining portion of the disposable oxygen permeable material layer 50 may be present on the top surface of the shallow trench isolation structure 40 due to an underetch, or the top surface of the shallow trench isolation structure 40 may be recessed due to an overetch.

Figure 9:
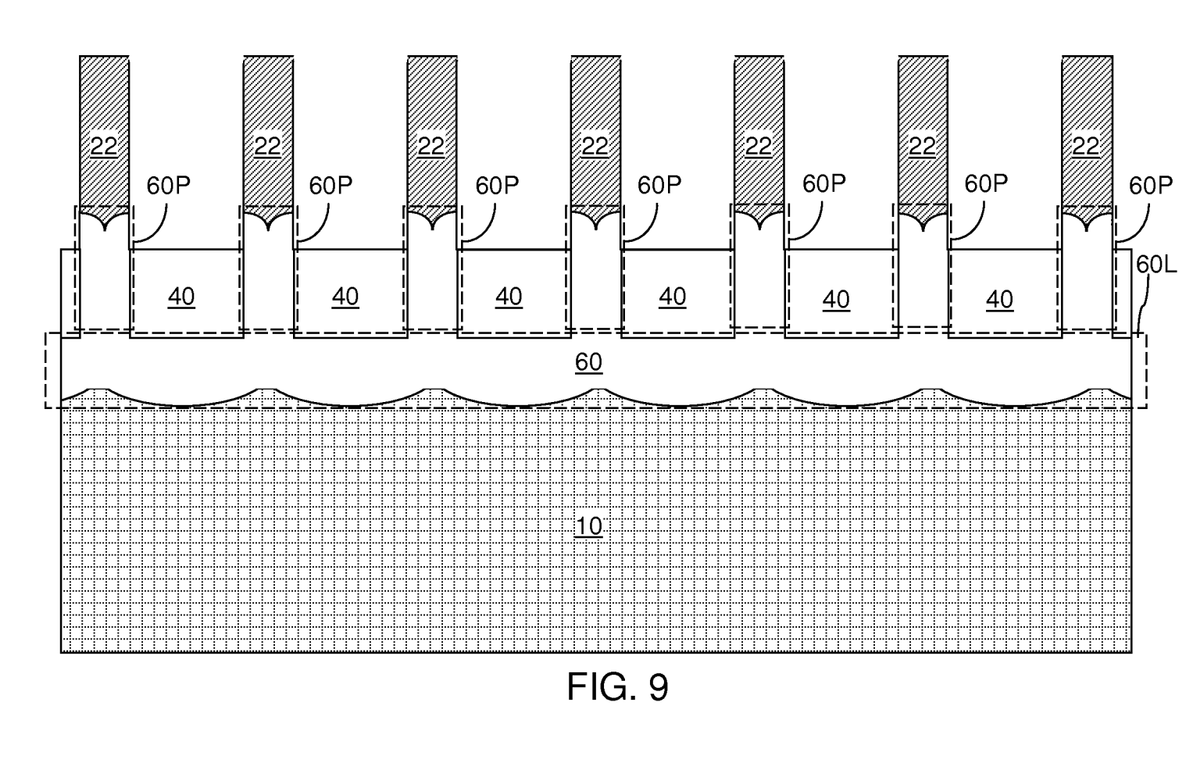
FIG. 9 is a vertical cross sectional view of the exemplary semiconductor structure after removal of the oxygen impermeable spacers and the oxygen impermeable caps according to an embodiment of the present disclosure.

Referring to FIG. 9, the oxygen impermeable spacers 32 and the oxygen impermeable caps 30 can be removed selective to the dielectric materials of the shallow trench isolation structure 40 and the contiguous semiconductor oxide portion 60. The removal of the oxygen impermeable spacers 32 and the oxygen impermeable caps 30 can be performed by an isotropic etch. For example, if the oxygen impermeable spacers 32 and the oxygen impermeable caps 30 include silicon nitride and if the shallow trench isolation structure 40 includes silicon oxide, the removal of the oxygen impermeable spacers 32 and the oxygen impermeable caps 30 can be performed by a wet etch process employing hot phosphoric acid. Sidewall surfaces and top surfaces of the germanium-enriched silicon germanium alloy fin 22 (which are the remaining portions of the plurality of silicon germanium alloy fins 20) are physically exposed by removing the plurality of oxygen impermeable spacers 32 and the plurality of oxygen impermeable caps 30.

In the exemplary semiconductor structure, the semiconductor oxide material portion 60 containing a semiconductor oxide layer 60L located on the semiconductor material layer 10 and a plurality of semiconductor oxide pedestals 60P that protrudes above the semiconductor oxide layer 60L. As used herein, a "pedestal" refers to a portion of a structure that protrudes from a planar surface of an underlying portion of the structure. The germanium-enriched silicon germanium alloy fins 22 are a plurality of silicon germanium alloy fins located on the plurality of semiconductor oxide pedestals 60P. Each of the plurality of silicon germanium alloy fins is located directly on, and above, one of the plurality of semiconductor oxide pedestals 22.

The shallow trench isolation structure 40 contacts a top surface of the semiconductor oxide layer 60L and sidewalls of the plurality of semiconductor oxide pedestals 60P. In one embodiment, bottommost portions of the plurality of germanium-enriched silicon germanium alloy fins can be more distal from the semiconductor oxide layer 60L than a planar top surface of the shallow trench isolation structure 40 is from the semiconductor oxide layer 60L. Each of the plurality of germanium-enriched silicon germanium alloy fins 22 includes a pair of concave bottom surfaces that contact surfaces of a semiconductor oxide pedestal 60P. The pair of concave surfaces is adjoined at an edge that is parallel to a pair of vertical sidewalls of one of the plurality of germanium-enriched silicon germanium alloy fins 22.

Because oxidation of the upper portion of the semiconductor material layer 10 proceeds from the interface with the shallow trench isolation structure 40 during the thermal oxidation process, portions of the interface between the semiconductor oxide layer 60L and the semiconductor material layer 10 protrude downward in regions that do not underlie any of the plurality of germanium-enriched silicon germanium alloy fins 22 with respect to other portions of the interface in regions that underlie the plurality of germanium-enriched silicon germanium alloy fins 20.

Because the semiconductor material layer 10 has a lesser atomic concentration or germanium than the silicon germanium alloy fins 20 prior to the thermal oxidation process, the plurality of semiconductor oxide pedestals 60P has a greater concentration of germanium atoms than the semiconductor oxide layer 60L. Further, because the semiconductor material layer 10 has a lesser atomic concentration or germanium than the silicon germanium alloy fins 20 prior to the thermal oxidation process, the ratio of germanium atoms to silicon atoms in the plurality of semiconductor oxide pedestals 60F is greater than the ratio of germanium atoms to silicon atoms in the semiconductor oxide layer 10.

In addition, because germanium atoms are pushed into unoxidized remaining portions of the silicon germanium alloy fins 20 during the thermal oxidation process, the ratio of germanium atoms to silicon atoms in the plurality of germanium-enriched silicon germanium alloy fins 22 is greater than the ratio of germanium atoms to silicon atoms in the plurality of semiconductor oxide pedestals 60P. This feature can be advantageously employed to provide single crystalline germanium-enriched silicon germanium alloy fins 22 with a higher atomic concentration of germanium than is possible by epitaxial deposition of a single crystalline silicon germanium only. Specifically, increase in the atomic concentration of germanium in the germanium-enriched silicon germanium alloy fins 22 does not generate crystalline defects within the germanium-enriched silicon germanium alloy fins 22 because the germanium-enriched silicon germanium alloy fins 22 are not epitaxially aligned to the semiconductor material layer 10 due to formation of the semiconductor oxide material portion 60. By increasing the atomic concentration of germanium while the semiconductor oxide material portion 60 removes the epitaxial alignment between the semiconductor material layer 10 and the germanium-enriched silicon germanium alloy fins 22, formation of dislocations and other crystalline defects in the germanium-enriched silicon germanium alloy fins 22 is avoided.

In one embodiment, the silicon germanium alloy layer 20L and the semiconductor material layer 10 can have an identical crystallographic structure, and can be epitaxially aligned to each other. Thus, the plurality of germanium-enriched silicon germanium alloy fins 22 and the semiconductor material layer 10 can have an identical crystallographic structure, and can have an identical spatial orientation for each crystallographic axis of the identical crystallographic structure.

Figure 10:
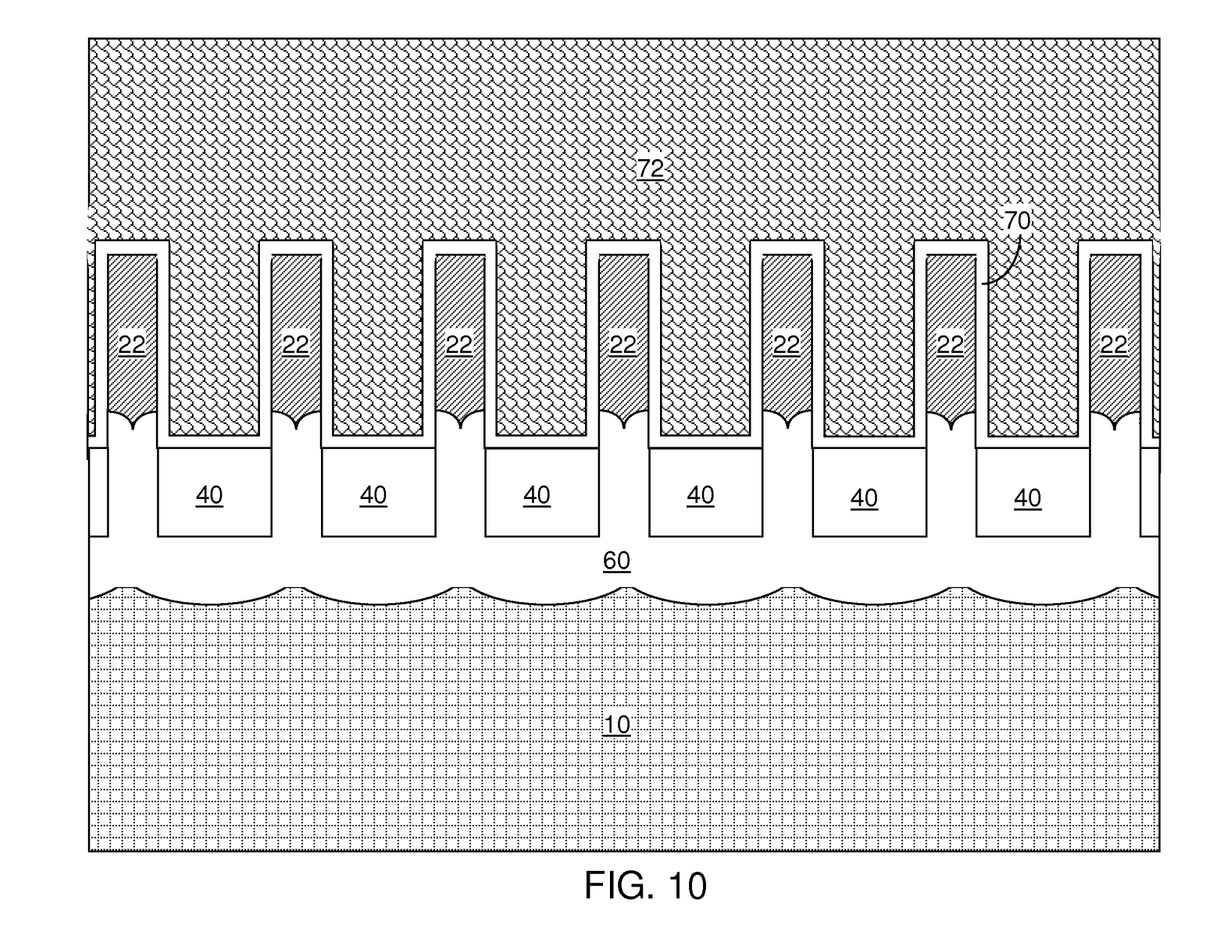
FIG. 10 is a vertical cross sectional view of the exemplary semiconductor structure after formation of a gate dielectric, a gate electrode, and a gate spacer according to an embodiment of the present disclosure.
Figure 10A:
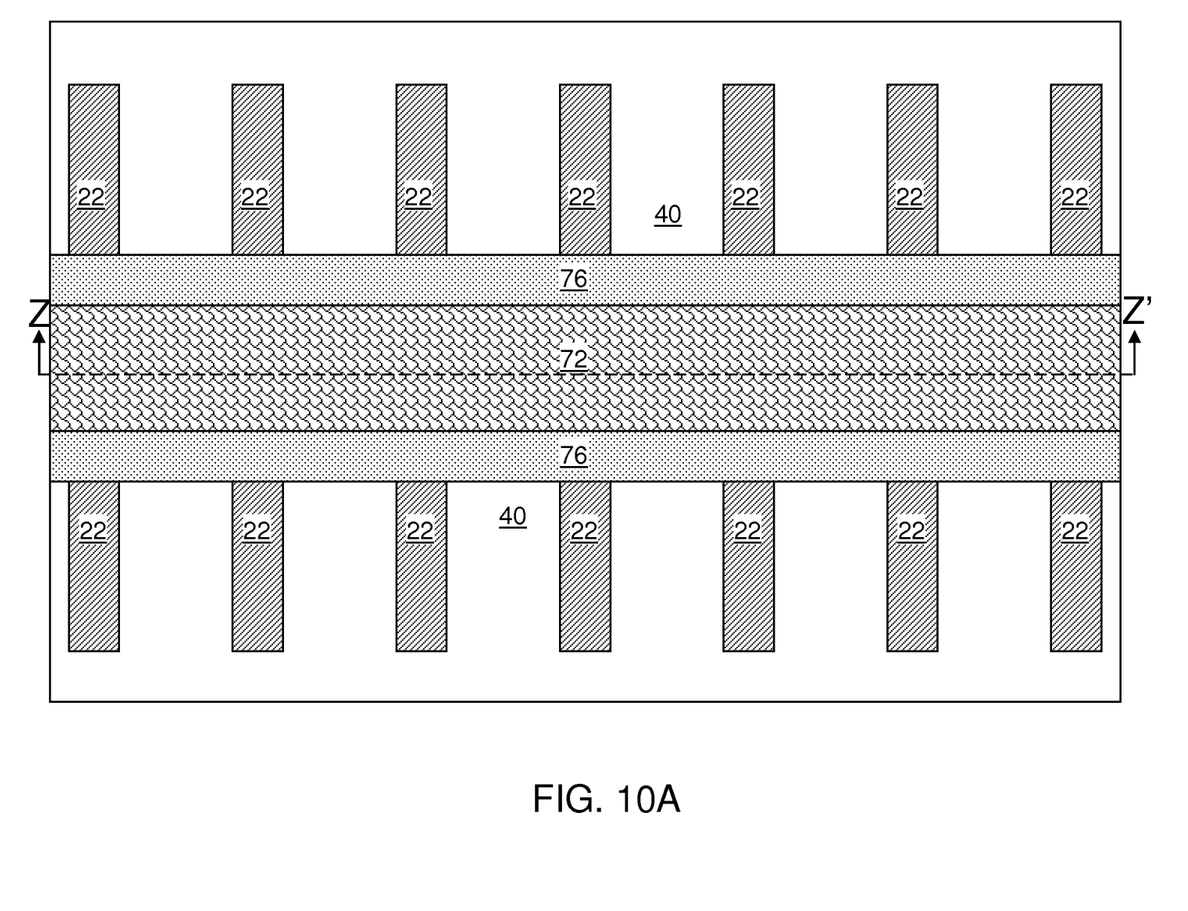
FIG. 10A is a top down view of the exemplary semiconductor structure of FIG. 10. The vertical plane Z-Z' represents the plane of the vertical cross sectional view of FIG. 10.

Referring to FIGS. 10 and 10A, a gate structure (70, 72) can be formed across the plurality of germanium-enriched silicon germanium alloy fins 22. The gate structure (70, 72) can straddle one or more of the plurality of germanium-enriched silicon germanium alloy fins 22. Optionally, a gate spacer 76 can be formed around the gate structure (70, 72). Various portions of the plurality of germanium-enriched silicon germanium alloy fins 22 can be doped to form source regions and drain regions to provide a fin field effect transistor.

While the disclosure has been described in terms of specific embodiments, it is evident in view of the foregoing description that numerous alternatives, modifications and variations will be apparent to those skilled in the art. Each of an embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor oxide material portion that contains a semiconductor oxide layer located on a semiconductor material layer and further contains a plurality of semiconductor oxide pedestals that protrudes above said semiconductor oxide layer;
   a plurality of silicon germanium alloy fins located on said plurality of semiconductor oxide pedestals, wherein each of said plurality of silicon germanium alloy fins is located directly on, and above, one of said plurality of semiconductor oxide pedestals, and wherein said plurality of semiconductor oxide pedestals has a greater concentration of germanium atoms than said semiconductor oxide layer; and
   a shallow trench isolation structure contacting a top surface of said semiconductor oxide layer and sidewalls of said plurality of semiconductor oxide pedestals, wherein bottommost portions of said plurality of silicon germanium alloy fins are more distal from said semiconductor oxide layer than a planar top surface of said shallow trench isolation structure is from said semiconductor oxide layer.

2. The semiconductor structure of claim 1, wherein each of said plurality of silicon germanium alloy fins comprises a pair of concave bottom surfaces that contact surfaces of said semiconductor oxide pedestal.

3. The semiconductor structure of claim 2, wherein said pair of concave surfaces is adjoined at an edge that is parallel to a pair of vertical sidewalls of one of said plurality of silicon germanium alloy fins.

4. The semiconductor structure of claim 1, wherein a portion of an interface between said semiconductor oxide layer and said semiconductor material layer protrudes downward in regions that do not underlie any of said plurality of silicon germanium alloy fins with respect to another portion of said interface in regions that underlie said plurality of silicon germanium alloy fins.

5. The semiconductor structure of claim 1, wherein a ratio of germanium atoms to silicon atoms in said plurality of silicon germanium alloy fins is greater than a ratio of germanium atoms to silicon atoms in said plurality of semiconductor oxide pedestals.

6. The semiconductor structure of claim 5, wherein said ratio of germanium atoms to silicon atoms in said plurality of semiconductor oxide pedestals is greater than a ratio of germanium atoms to silicon atoms in said semiconductor oxide layer.

7. The semiconductor structure of claim 1, wherein said semiconductor material layer is a single crystalline silicon layer.

8. The semiconductor structure of claim 7, wherein said plurality of silicon germanium alloy fins and said semiconductor material layer have an identical crystallographic structure, and have an identical spatial orientation for each crystallographic axis of said identical crystallographic structure.

9. The semiconductor structure of claim 1, further comprising a gate structure straddling said plurality of silicon germanium alloy fins and including a gate dielectric layer and a gate conductor.

10. A semiconductor structure comprising:
    a semiconductor oxide material portion that contains a semiconductor oxide layer located on a semiconductor material layer and further contains a plurality of semiconductor oxide pedestals that protrudes above said semiconductor oxide layer;
    a plurality of silicon germanium alloy fins located on said plurality of semiconductor oxide pedestals, wherein each of said plurality of silicon germanium alloy fins is located directly on, and above, one of said plurality of semiconductor oxide pedestals, and wherein a ratio of germanium atoms to silicon atoms in said plurality of silicon germanium alloy fins is greater than a ratio of germanium atoms to silicon atoms in said plurality of semiconductor oxide pedestals; and
    a shallow trench isolation structure contacting a top surface of said semiconductor oxide layer and sidewalls of said plurality of semiconductor oxide pedestals, wherein bottommost portions of said plurality of silicon germanium alloy fins are more distal from said semiconductor oxide layer than a planar top surface of said shallow trench isolation structure is from said semiconductor oxide layer.

11. The semiconductor structure of claim 10, wherein each of said plurality of silicon germanium alloy fins comprises a pair of concave bottom surfaces that contact surfaces of said semiconductor oxide pedestal.

12. The semiconductor structure of claim 11, wherein said pair of concave surfaces is adjoined at an edge that is parallel to a pair of vertical sidewalls of one of said plurality of silicon germanium alloy fins.

13. The semiconductor structure of claim 10, wherein a portion of an interface between said semiconductor oxide layer and said semiconductor material layer protrudes downward in regions that do not underlie any of said plurality of silicon germanium alloy fins with respect to another portion of said interface in regions that underlie said plurality of silicon germanium alloy fins.

14. The semiconductor structure of claim 10, wherein said ratio of germanium atoms to silicon atoms in said plurality of semiconductor oxide pedestals is greater than a ratio of germanium atoms to silicon atoms in said semiconductor oxide layer.

15. The semiconductor structure of claim 10, wherein said semiconductor material layer is a single crystalline silicon layer.

16. The semiconductor structure of claim 15, wherein said plurality of silicon germanium alloy fins and said semiconductor material layer have an identical crystallographic structure, and have an identical spatial orientation for each crystallographic axis of said identical crystallographic structure.

17. The semiconductor structure of claim 10, further comprising a gate structure straddling said plurality of silicon germanium alloy fins and including a gate dielectric layer and a gate conductor.

18. A semiconductor structure comprising:
    a semiconductor oxide material portion that contains a semiconductor oxide layer located on a semiconductor material layer and further contains a plurality of semiconductor oxide pedestals that protrudes above said semiconductor oxide layer;
    a plurality of silicon germanium alloy fins located on said plurality of semiconductor oxide pedestals, wherein each of said plurality of silicon germanium alloy fins is located directly on, and above, one of said plurality of semiconductor oxide pedestals, and wherein each of said plurality of silicon germanium alloy fins comprises a pair of concave bottom surfaces that contact surfaces of said semiconductor oxide pedestal; and
    a shallow trench isolation structure contacting a top surface of said semiconductor oxide layer and sidewalls of said plurality of semiconductor oxide pedestals, wherein bottommost portions of said plurality of silicon germanium alloy fins are more distal from said semiconductor oxide layer than a planar top surface of said shallow trench isolation structure is from said semiconductor oxide layer.

* * * * *